United States Patent
Yamada et al.

(10) Patent No.: US 6,193,905 B1
(45) Date of Patent: *Feb. 27, 2001

(54) IMMERSION COOLING COOLANT

(75) Inventors: Mitsutaka Yamada, Atsugi; Kishio Yokouchi, Machida; Nobuo Kamehara, Isehara; Koichi Niwa, Tama, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/380,312

(22) Filed: Jan. 30, 1995

Related U.S. Application Data

(63) Continuation of application No. 08/053,514, filed on Apr. 28, 1993, now abandoned, which is a continuation of application No. 07/697,569, filed on May 9, 1991, now abandoned.

(30) Foreign Application Priority Data

May 11, 1990 (JP) .................................................. 2-119969

(51) Int. Cl.$^7$ ...................................................... C09K 5/04
(52) U.S. Cl. .................................. 252/67; 252/73; 252/77
(58) Field of Search .................................. 252/77, 73, 67

(56) References Cited

U.S. PATENT DOCUMENTS

| | | |
|---|---|---|
| 3,741,292 | 6/1973 | Aakalu et al. . |
| 4,704,658 | 11/1987 | Yokouchi et al. . |
| 5,089,152 * | 2/1992 | Flynn et al. .......................... 252/194 |
| 5,395,540 * | 3/1995 | Gisser et al. ............................ 252/67 |
| 5,441,659 * | 8/1995 | Minor ..................................... 252/67 |

FOREIGN PATENT DOCUMENTS

| | | |
|---|---|---|
| 0369827 | 5/1990 | (EP) . |
| 50-43500 | 4/1975 | (JP) . |
| 52-38662 | 3/1977 | (JP) . |
| 54-7657 | 1/1979 | (JP) . |
| 54-7658 | 1/1979 | (JP) . |
| 59-058081 | 4/1984 | (JP) . |
| 59-58081 | 4/1984 | (JP) . |
| 59-125643 | 7/1984 | (JP) . |
| 62-93211 * | 4/1987 | (JP) . |
| 64-65185 * | 3/1989 | (JP) . |
| 84/03624 * | 9/1984 | (WO) . |

OTHER PUBLICATIONS

IBM Tech Disclosure Bulletin; vol. 20;No. 11B;Apr. 1978;Power Dissipation by Controlling Bubble Size of Liquid Coolant; J.F. Fugardi and L. V. Gregor, p4823.

1987 Proceedings 37th Electronic Components Conference; May 11–13, 1987; Immersion Cooling High Density Packaging; Kishio Yokouchi, Nobuo Kamehara; and Koichi Niwa, pp 545–549.

"Immersion Cooling for High–Density Packaging" IEEE Transaction on Components, Hybrids, and Manufacture Technology, vol. CHMT–12, No. 4, Dec. 1987, pp643–646.

"Studies on Immersion Cooling For High Density Packaging" ISHM '87 Proceedings pp175–180.

* cited by examiner

*Primary Examiner*—Margaret Einsmann
(74) *Attorney, Agent, or Firm*—Armstrong, Westerman, Hattori, McLeland & Naughton

(57) ABSTRACT

A coolant for cooling a semiconductor element by direct immersion, cooling, which has an improved cooling capability, is disclosed. The coolant comprises a low boiling point fluorocarbon having a boiling point of 30° C. to 100° C. and a high boiling point fluorocarbon having a boiling point higher than that of the low boiling point fluorocarbon by at least 100° C.; an amount of the high boiling point fluorocarbon being less than 20% by volume, based on the volume of the low boiling point fluorocarbon.

6 Claims, 11 Drawing Sheets a --- CONVECTION COOLING RANGE b --- BUMPING c --- NUCLEATED BOILING COOLING RANGE d --- TRANSITION POINT e --- FILM BUILING RANGE

IMMERSION COOLING COOLANT

This application is a continuation of application Ser. No. 08/053,514 filed Apr. 28, 1993 abandoned; which is a continuation of application Ser. No. 07/697,569 filed May 9, 1991, now abandoned.

BACKGROUND OF THE INVENTION

1. Field of the Invention

The present invention relates to a liquid coolant for immersion cooling, and an electronic device using the coolant.

2. Description of the Related Art

When a heat generator is cooled by a direct immersion in a coolant, relationships between the difference ΔT of the temperatures of the heat generator and the coolant (superheat; ° C.) and the heat flux (W/cm$^2$) removed from a unit area of the heat generator by the coolant generally exist as shown in FIGS. 1A and 1B. As the temperature of the heat generator is elevated, the heat flux is increased in accordance with the ΔT, but the coolant tends to bump and the heat flux is not increased when the phase shifts from the natural convection to the nucleated boiling phase, and then the nucleated boiling phase continues for a while and is shifted to a film boiling phase. The heat flux reaches the maximum when the nucleated boiling phase is being shifted to the film boiling phase.

It is known to use a coolant having a low boiling point, mixed with another coolant having a higher boiling point, for cooling by a direct immersion of a semiconductor element in the coolant.

The inventors investigated and developed methods of cooling a semiconductor element by a direct immersion in a liquid coolant, and these methods are disclosed or published in (1) "Evaporation Cooling Module for Semiconductor" (U.S. Pat. No. 4,704,658), (2) "Cooling Computers by Direct Immersing LSIs in Liquid", Nikkei Electronics No. 425, Jul. 13, 1987 p 167–176, (3) "Overheat Phenomena in Boiling Cooling", 1982 Autumn 43rd Applied Physics Society Conference Proceedings, Sep. 28–30, p 569, 29-F-3, (4) "Liquid Cooling Type Electronic Device" (Japanese Unexamined Patent Publication No. 59-125643), (5) "Immersion Cooling for High-Density Packaging" IEEE TRANSACTION ON COMPONENTS, HYBRIDS, AND MANUFACTURE TECHNOLOGY, vol. CHMT-12, No. 4, Dec. 1987, p 643–646, (6) "STUDIES ON IMMERSION COOLING FOR HIGH DENSITY PACKAGING" ISHM '87 Proceedings p 175–180, (7) "Cooling Technique for Semiconductor Element" Semiconductor Integrated Circuit Techniques 24th Symposium Conference Papers, Jun. 2–3, p 30–35, etc.

U.S. Pat. No. 4,704,658 describes fleons $C_2Cl_3F_3$ (b.p. 49° C.), $C_{5\ F12}$ (b.p. 30° C.), $C_6F_{14}$ (b.p. 56° C.), etc. as the coolant, and discloses cooling modules corresponding to FIGS. 10 to 18 attached to this specification.

Nikkei Electronics No. 425 states that fluorocarbons having a molecular weight of several hundreds, and chemically stable as a liquid coolant for a direct immersion cooling of LSIs, are a colorless transparent liquid and have a boiling point of 30–150° C. (an example is a fluorocarbon having a boiling point of 56° C.; p-fluorohexane) and discloses that a coolant mixture does not have a specific boiling point and does have a temperature range of boiling, and that overshoot can be reduced by combining a plurality of coolants; the minimum overshoot is obtained by mixing two fluorocarbons having boiling points of 56° C. (p-fluorohexane) and 101° C. (p-fluoro-2-octanone) in a ratio of 20:80.

1982 Autumn 43rd Applied Physics Society Conference Proceedings states that a mixture of two coolants having boiling points of 50° C. and 100° C. provides substantially no overheating, i.e., a deviation from the ideal starting point of the nucleated boiling.

Japanese Unexamined Patent Publication No. 59-125643 describes a coolant comprising two fluorocarbons having boiling points which are at least 10° C. different from each other, in respective amounts of at least 10% by weight; specifically, fluorocarbons having boiling points of 50° C. and 102° C.

IEEE TRANSACTION ON COMPONENTS, HYBRIDS, AND MANUFACTURE TECHNOLOGY, vol. CHMT-12 describes a mixture of fluorocarbons having boiling points of 56° C. and 102° C., for minimizing overshoot.

ISHM '87 Proceedings states that perfluoro-carbon $C_6F_{14}$ (b.p. 56° C.) is suitable as a coolant at room temperature, and that the heat flux of $C_6F_{14}$ (b.p. 56° C.) is 10 W/cm$^2$ when the film boiling occurs.

Semiconductor Integrated Circuit Techniques 24th Symposium Conference Papers disclose that a feon has a cooling capability of 20 W/cm by boiling cooling, the maximum heat flux relates to the gasification heat of a liquid coolant, and the size of bubbles due to boiling of a coolant relates to a surface tension of the coolant, for example, 0.5 mm for $C_6F_{14}$ (b.p. 560° C.), and is small, i.e., 0.05 mm, when the coolant is liquid helium having a small surface tension of 0.12 dyne/cm, whereby a three-dimensional high density packaging is possible.

The present invention is based on the results of the above investigation, and the object of the present invention is to improve the maximum heat flux of a coolant, and a cooling capability at a unit area of a semiconductor element by a coolant, while the temperature of film boiling is maintained as low as a temperature range allowable for a semiconductor element.

SUMMARY OF THE INVENTION

The present invention provides a coolant for cooling a semiconductor element by direct immersion, comprising a low boiling point fluorocarbon having a boiling point of 30° C. to 100° C. and a high boiling point fluorocarbon having a boiling point higher than that of the low boiling point fluorocarbon by at least 100° C., an amount of the high boiling point fluorocarbon being less than 20% by volume based on the volume of the low boiling point fluorocarbon.

The present invention is based on the finding that, by adding a high boiling point fluorocarbon having a boiling point of 215° C. or 253° C. to a low boiling point fluorocarbon having a boiling point of 30° C. to 100° C., the surface tension of the coolant for boiling cooling is surprisingly lowered. As the surface tension of the coolant is lowered, the size of bubbles formed by boiling is reduced and the cooling capability of the coolant is increased at a temperature where the phase is shifted to the film boiling. Since the size of bubbles formed by boiling is smaller, the space between semiconductor elements mounted on a substrate can be narrowed without lowering the maximum heat flux of the coolant, thereby allowing a high density packaging of semiconductor elements.

Thus, in accordance with the present invention, there is also provided a boiling cooling-type electronic device comprising an electronic element having a heat generating portion immersed in a liquid coolant, the liquid coolant comprising a low boiling point fluorocarbon having a boiling point of 30° C. to 100° C. and a high boiling point fluorocarbon having a boiling point higher than that of the low boiling point fluorocarbon by at least 100° C.; an amount of the high boiling point fluorocarbon being less than 20% by volume based on the volume of the low boiling point fluorocarbon.

Typically, the structure of the device can be expressed as a module for evaporation cooling of a plurality of semiconductor chips mounted on a common, generally planar surface of a circuit board and immersed in a liquid coolant contained within the module, said liquid coolant including, during cooling, a first gas of bubbles of evaporated coolant and a second gas such as air, comprising:

(a) a case forming a chamber and having at least one sidewall with an opening formed therein in communication with said chamber, said sidewall being adapted for receiving a planar circuit board thereon in hermetically sealed relationship for closing said opening and with the common, generally planar surface thereof disposed inwardly with respect to said chamber for positioning the plurality of semiconductor chips mounted thereon within said chamber, said case, with said opening enclosed by the circuit board, defining a sealed interior cooling chamber for receiving sufficient liquid coolant therewithin to immerse the plurality of semiconductor chips within the liquid coolant;

(b) at least one heat exchanger within the liquid coolant and mounted at a predetermined position within said cooling chamber, adjacent corresponding, immersed semiconductor chips of a plurality thereof mounted on the circuit board enclosing the sidewall openings of the case, for cooling the liquid coolant and reliquifying the first gas; and (c) porous metal means associated with each said heat exchanger and immersed within the coolant, for trapping the first gas, allowing the second gas to pass therethrough, and maintaining contact of the first gas with said associated heat exchanger, and optionally (d) means associated with each said bubble trapping means, immersed within the coolant and mounted within said cooling chamber, for guiding said fist gas toward said associated trapping means.

The liquid coolant components of low and high boiling point components are selected from fluorocarbons, because they are chemically stable. The term "fluorocarbons" in this context means a compound composed of carbon and fluorine atoms, optionally with oxygen, nitrogen, sulfur or other atoms, or a hydrocarbon having a skeleton mainly composed of carbon atoms in which all or most hydrogen atoms are substituted by fluorine atoms. Such a compound is chemically stable because the carbon-fluorine bond is very strong and stable.

The low boiling point fluorocarbon is selected from fluorocarbons having a boiling point of 30° C. to 100° C. The semiconductor element should be cooled to a temperature not higher than about 80° C., preferably not higher than 70° C., because the maximum junction temperature is about 85° C., with a cooling margin of 15° C. To obtain such a cooling by room temperature cooling, the low boiling point fluorocarbon should have a boiling point in the above temperature range. A preferable range of the boiling point is 30 to 100° C., with a more preferable range being 30 to 60° C. If the boiling point of the low boiling point fluorocarbon is lower than 30° C. or room temperature, particularly lower than the ice point, the coolant would be cooled to lower than the room temperature or the ice point, and thus the cooling efficiency undesirably lowered.

Examples of the low boiling point fluorocarbon include $CF_3(CF_2)_4CF_3$ (FC-72, b.p. 56° C.);

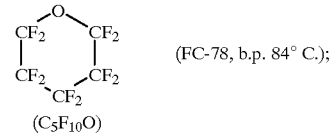

(FC-78, b.p. 84° C.);

($C_5F_{10}O$)

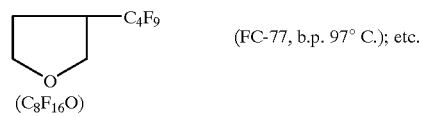

(FC-77, b.p. 97° C.); etc.

($C_8F_{16}O$)

The high boiling point fluorocarbon is selected from fluorocarbons having a boiling point higher than that of the low boiling point fluorocarbon by at least 100° C. It was found that the maximum heat flux of the coolant can be remarkably increased by adding a small amount of a fluorocarbon having such a boiling point difference. The maximum heat flux of a coolant is obtained at a point whereat the nucleated boiling is shifted to the film boiling. By adding such a high boiling point fluorocarbon in a small amount, the cooling capability of the coolant is unexpectedly increased. If the difference of the boiling points of fluorocarbons is not higher than 100° C., a desired effect of increasing the cooling capability cannot be obtained. A preferred difference of the boiling points of fluorocarbons is at least 100° C., more preferably 150° C. or more.

Examples of the high boiling point fluorocarbon include $C_{13}F_{26}$ (FC-40, b.p. 155° C.);

FC-43 (b.p. 174° C.);

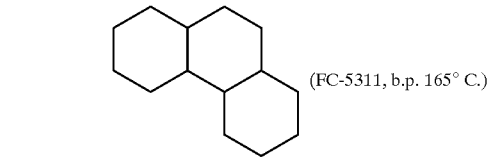

(FC-5311, b.p. 165° C.)

($C_{14}F_{24}$)

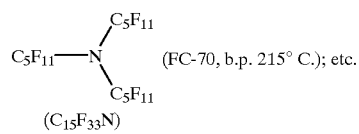

(FC-70, b.p. 215° C.); etc.

($C_{15}F_{33}N$)

Each of the low and high boiling point fluorocarbons may be a single fluorocarbon or a mixture thereof.

The amount of the high boiling point fluorocarbon is up to 20% by volume based on the volume of the low boiling point fluorocarbon, preferably less than 9% by volume, more preferably 1.5 to 6% by volume. If the amount of the high boiling point fluorocarbon is too high, the film boiling temperature is undesirably elevated and the reliability of a semiconductor element is lost.

As described before with reference to FIG. 1, when a heat generator is cooled by a direct immersion in a coolant, with an increase of the temperature of the heat generator, the natural convection is shifted to the nucleated boiling, and further, to the film boiling. The heat flux is remarkably higher in the nucleated boiling phase than in the natural convection phase, and is lowered after the nucleated boiling is shifted to the film boiling. Therefore, preferably the cooling is conducted in a temperature range of from the natural convection to the nucleated boiling, particularly in a temperature range of the nucleated boiling, and it is preferable to use a coolant having a maximum or critical heat flux of a coolant, since as large as possible a heat flux at the nucleated boiling is shifted to the film boiling. The coolant of the present invention is used for cooling a semiconductor element in a temperature range of from the natural convection to the nucleated boiling, mainly in a temperature range of the nucleated boiling, and the heat flux thereof at a unit area of a body to be cooled is remarkably improved. It is considered that the heat flux is increased by lowering the surface tension when a small amount of a high boiling point fluorocarbon is added.

Thus, the coolant of fluorocarbon mixture of the present invention is suitable as a coolant used at a near room temperature, because of a high stability and a high heat transfer capability thereof. Further, the space between LSIs mounted on a substrate depends on the nature of the coolant, more specifically, the size of bubbles formed by boiling, and the space between LSIs or semiconductor elements can be reduced to 2 to 0.8 mm, without causing film boiling, by using a fluorocarbon mixture coolant of the present invention. As a result, a dense packaging while maintaining a high cooling capability is possible, and a compaction of a liquid cooling device as a whole is possible.

The above is an outline of the development of the present invention, and the effects of the present invention, and known liquid coolants found by the inventors are briefly described below.

Toshiba discloses a liquid coolant suitable for cooling transistors and thyristors, etc. (Japanese Examined Patent Publication No. 51-20743), a liquid coolant suitable for cooling oil-immersed transforms, etc. (Japanese Examined Patent Publication No. 53-20319), and a liquid coolant with a controlled boiling point for transistors, thyristors, LSI's, transformers, etc. (Japanese Unexamined Patent Publication No. 59-58081). These all comprise a liquid coolant composed of a feon (R113, R112) mixed with a silicone oil, and the cooling mechanism used is a gas condensation liquefying. The silicone oil is added to suppress bubbling, to thus prevent a lowering of a breakdown voltage caused by bubbles, or to prevent a chemical action of the feon, or to control the boiling point, etc. These methods are different from that of the present invention, in that a silicone oil is added to the coolant.

Hitachi discloses semiconductor devices in which two coolants having different boiling points are enclosed (Japanese Unexamined Patent Publication Nos. 49-68674, 52-38662 and 61-104696). Particularly, Japanese Unexamined Patent Publication No. 61-104696 describes a non-azeotropic mixed coolant comprising two or more components having a difference of the boiling point of at least 70° C. The use of the non-azeotropic mixed coolant is intended to improve the latent evaporation heat which determines the cooling capability of the coolant. Therefore, these coolants are not to be used for cooling by the nucleated boiling, as is the coolant of the present invention. Also, the coolants of JPP 61-104696 comprise a low boiling point coolant having a boiling point lower than the ice point, which is excluded from the present invention because it is not suitable for cooling a semiconductor element which generates a large amount of heat.

The coolant of the present invention is different from the above coolants in that the mixed coolant components are composed of fluorocarbons, the coolant is used at room temperature, mainly by the nucleated boiling, the low boiling point component has a boiling point of 30° C. to 100° C., and the high boiling point component has a boiling point higher than that of the low boiling point component by at least 100° C.

DESCRIPTION OF THE PREFERRED EMBODIMENTS

Figure 1A:
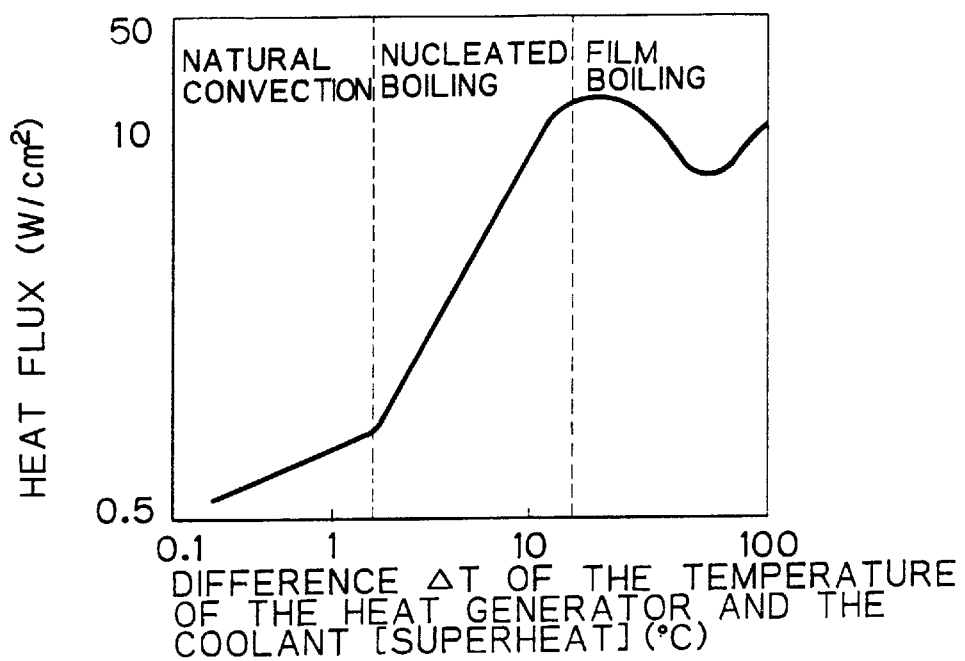
FIGS. 1A and 1B show relationships between the temperature difference of the coolant and heat generator and the heat flux removed from the heat generator.
Figure 1B:
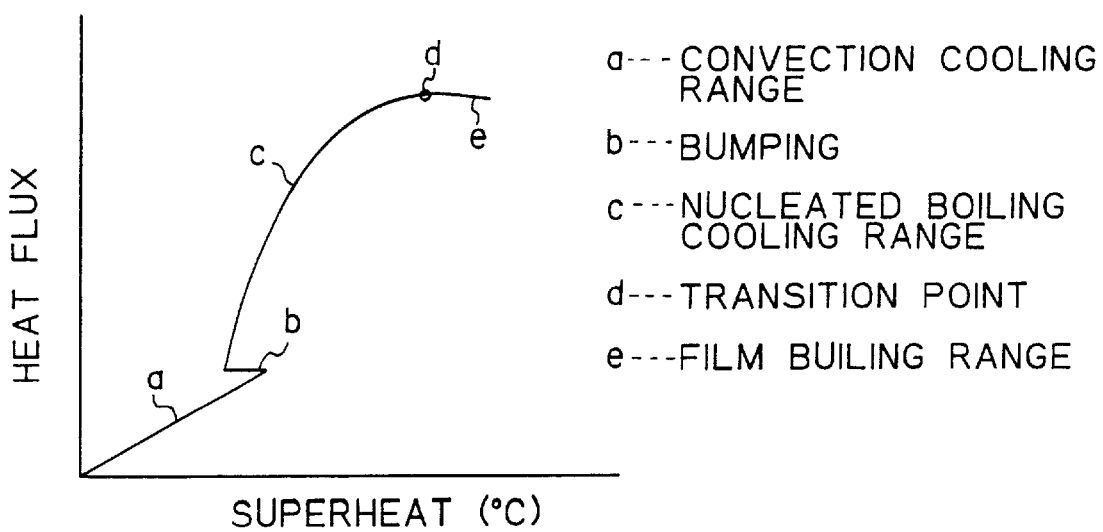
Figure 2:
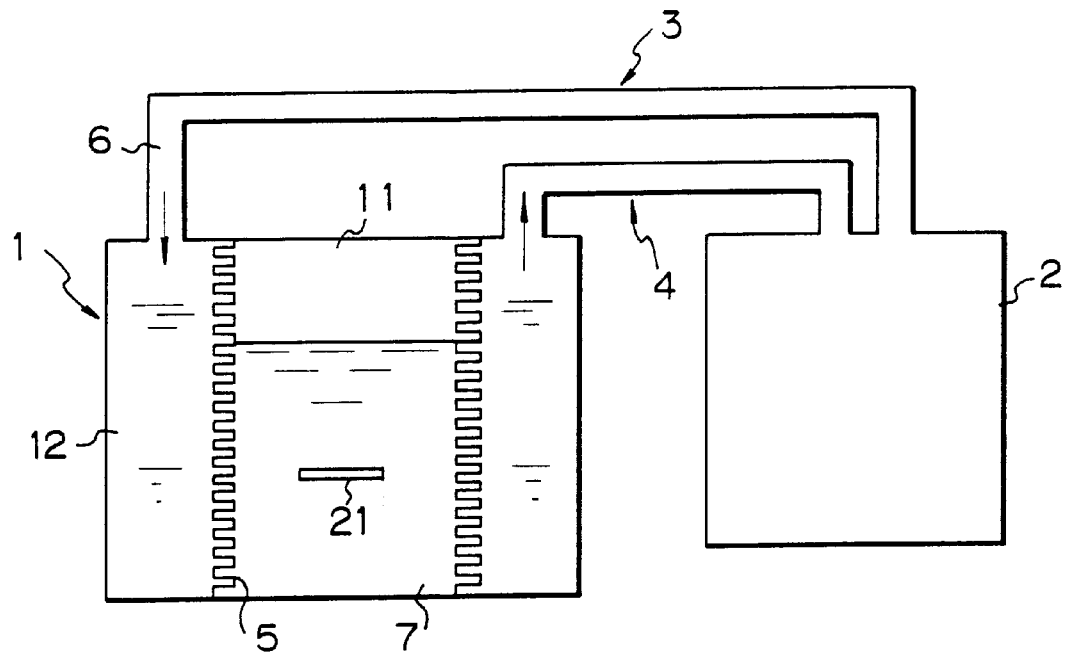
FIG. 2 is a sectional view of a device for measuring the cooling capability of a boiling cooling coolant.

FIG. 2 illustrates a section of a device for measuring the cooling capability of a boiling cooling coolant. The device comprises a cooling case 1, a circulating cooler 2, and pipes 3 and 4 for supplying and discharging water as a coolant. The cooling case 1 has a double wall structure in which a fluorocarbon coolant to be measured is contained in an inside case 11, water cooled to a predetermined temperature by the circulating cooler 2 is circulated in an outside case 12 through the pipes 3 and 4, and a fin 5 is provided between the inside and outside cases 11 and 12 for improving the heat transfer efficiency.

Figure 3A:
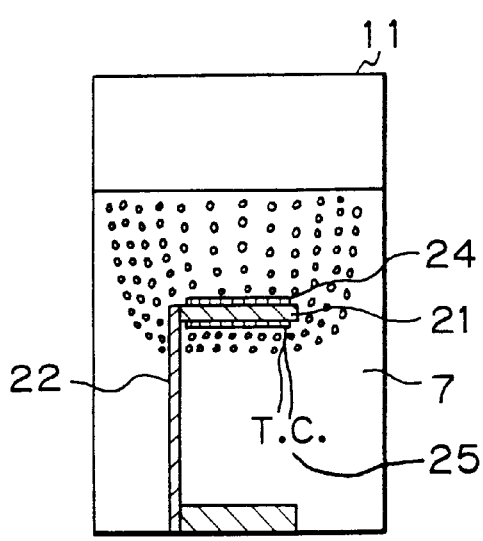
FIGS. 3A and 3B are sectional views of cooling devices in which two sides or one side of a semiconductor element are cooled by a coolant.
Figure 3B:
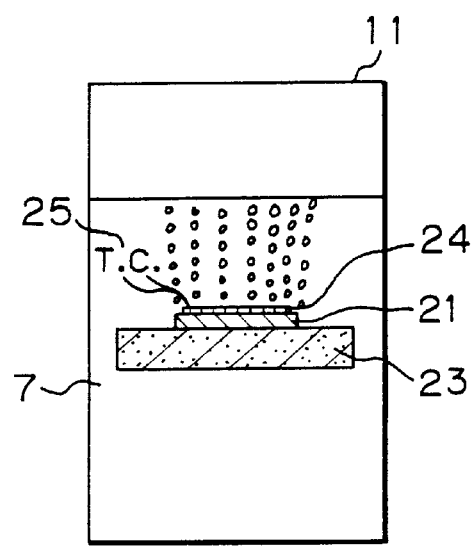

A total amount of 400 ml of a fluorocarbon having a boiling point of 56° C. mixed with a certain amount of a high boiling point fluorocarbon having a boiling point of 215° C. or 253° C. was charged as a coolant in the inside case 11 of the cooling case 1, and an Si chip, 13 mm square, as a model of an LSI, was immersed in the coolant. The Si chip was immersed in the coolant in such a manner that both sides of the chip were boiling cooled by supporting the chip 21 at an end thereof (FIG. 3A), and such that a single side of the chip 21 was boiling cooled by mounting the chip 21 on a ceramic substrate 23 (FIG. 3B). In the double-sided cooling, the heat flux was almost double that of the single-sided cooling. The heat generator was made by forming a NiCr film 24 on both or one surface of the 13 mm square Si chip 21 and was immersed in the coolant in the inside case 11 while the Si chip was supported by a support 22, so that the chip 21 was horizontally arranged. The heat flux of the heat generator was varied and the temperature of the Si chip 21 was measured. The measurement of the temperature of the surface of the heat generator was carried out by a copper-constantan thermocouple 25.

Figure 4:
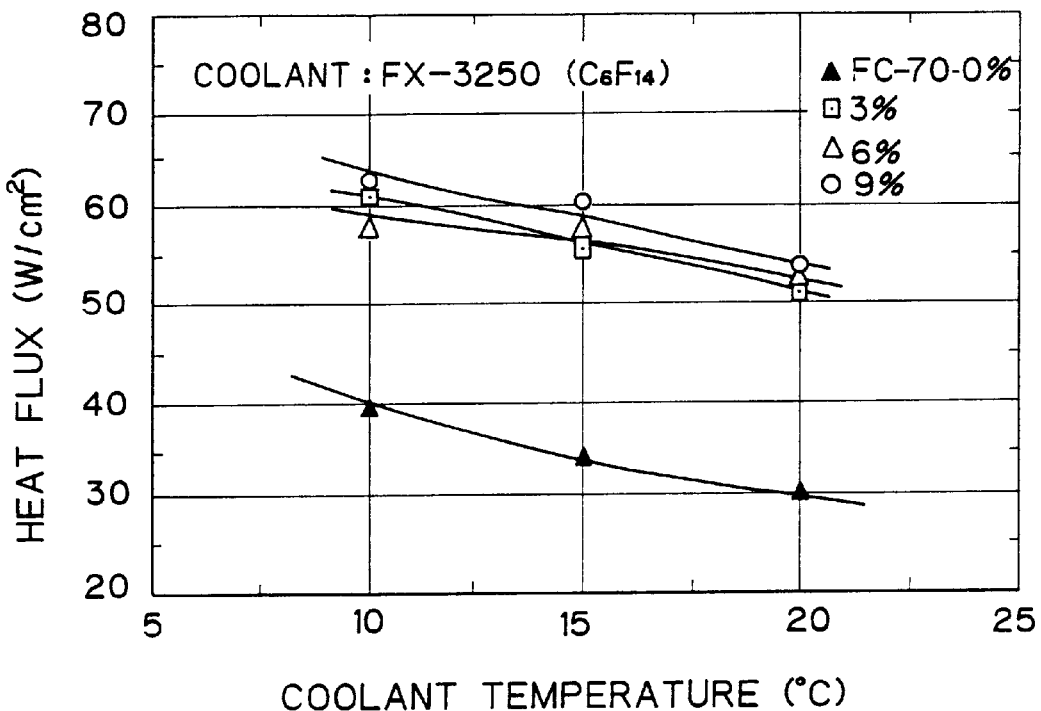
FIGS. 4 and 5 show relationships between the heat flux of a coolant and the temperature of the coolant in the double-sided cooling.

FIG. 4 shows relationships, in the double-sided cooling, between the heat flux and the temperature of a mixed fluorocarbon coolant in which a low boiling point component was FX3250 ($C_6F_{14}$; sold by 3M) having a boiling point of 56° C., with which a high boiling point component FC-70 (3M) having a boiling point of 215° C. was mixed in an amount of 0, 3, 6 or 9% by volume. The temperature of the coolant was measured by a copper-constantan thermocouple with a diameter of 0.1 mm. The temperature of the cooling water at the inlet of the outside case 12 of the cooling case 1 supplied from the circulating cooler 2 was 5 to 18° C., the temperature of the cooling water discharged at the outlet of the outside case 12 was 8 to 22° C., and the feed of the cooling water was 250 ml/min. The Si chip was cooled from both sides in this case.

As seen from FIG. 4, the heat fluxes of the mixed coolants comprising FX3250 (b.p. 56° C.) with 3 to 9 vol % FC-70 (b.p. 215° C.) were about 1.5 to 1.8 times that of FX3250 (b.p. 56° C.) alone, at the same coolant temperature, specifically 1.47 to 1.56 times at 10° C. and 1.70 to 1.80 times at 20° C., and thus the cooling capability of the fluorocarbon coolant is remarkably improved by the mixing of the coolants.

Figure 5:
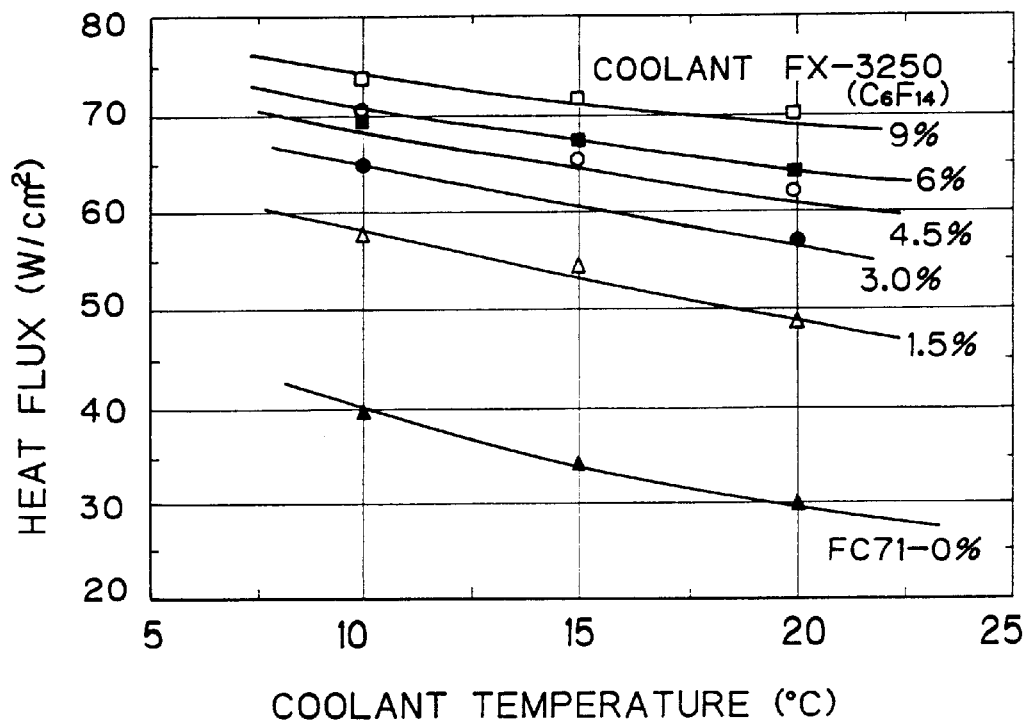
Figure 6:
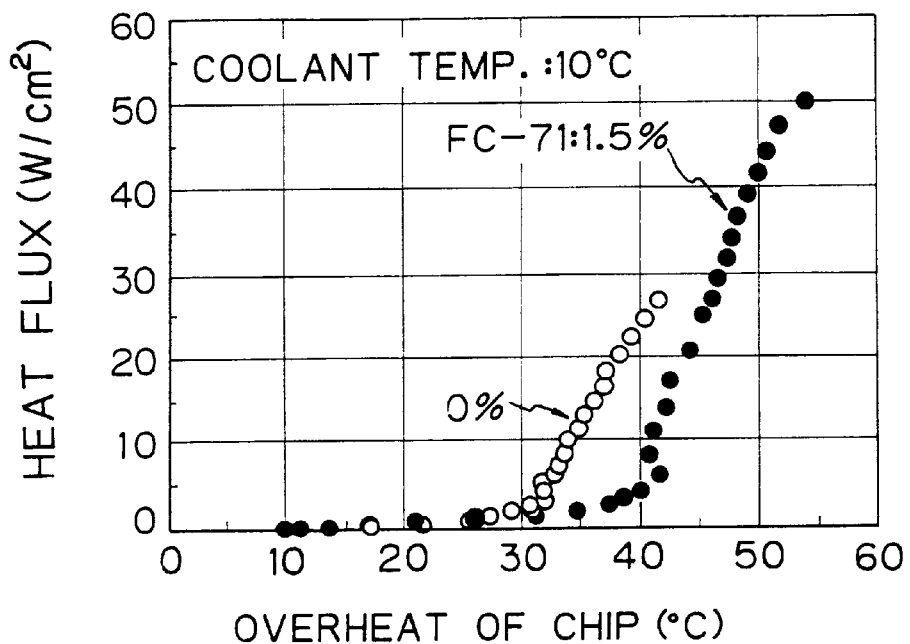
FIG. 6 shows relationships between the overheating of a semiconductor element and the heat flux of a coolant in the double-sided cooling.

FIG. 5 shows relationships, in the double-sided cooling, between the heat flux and the temperature of a mixed fluorocarbon coolant in which a low boiling point component was FX3250 (3M) having a boiling point of 56° C., with which a high boiling point component FC-71 (3M) having a boiling point of 253° C. was mixed in an amount of 0, 1.5, 3, 4.5, 6 or 9% by volume. As seen in FIG. 6, the heat fluxes of the mixed coolants comprising FX3250 (b.p. 56° C.) with 1.5 to 9 vol % FC-71 (b.p. 253° C.) were remarkably improved to 1.43 to 1.85 times that of FX3250 (b.p. 56° C.) at 10° C. and 1.60 to 2.33 times at 20° C., and thus the cooling capability of the fluorocarbon coolant was remarkably improved by the mixing of the coolants.

FIG. 6 shows an overheating of a heat generator(LIST chip) when the natural convection is shifted to the nucleated boiling. The heat generator having a NiCr film on the surface thereof, as described above, was immersed in a coolant in the same manner as shown in FIG. 3A (double-sided cooling), the heat flux of the heat generator was varied, and the temperature of the surface of the Si chip heat generator and the saturation temperature of the coolant were measured, to determine the amount of overheating of the heat generator just before the nucleated boiling.

The coolant used was a mixed fluorocarbon comprising FX3250 (3M) having a boiling point of 56° C. and 1.5 vol % FC-71 (3M) having a boiling point of 253° C., and the comparative coolant was FX3250 (3M) alone. In FIG. 6, the ordinate shows the heat flux and the abscissa shows the overheating of the chip.

As seen in FIG. 6, when the mixed coolant containing 1.5 vol % FC-71 was controlled to a temperature of 10° C., the heat flux was 50 W/cm² and the overheating of the chip was 54° C. When the low boiling point FX3250 alone was used and controlled to 10° C., the heat flux was 27 W/cm² and the overheating of the chip was 42° C. The temperature of the chip was therefore 64° C. in the mixed coolant case and 52° C. in the FX3250 alone case.

Thus, the heat flux was increased by about 1.85 times, i.e., the cooling capability is improved, although the degree of overheating of the Si chip heat generator was slightly increased.

Figure 7:
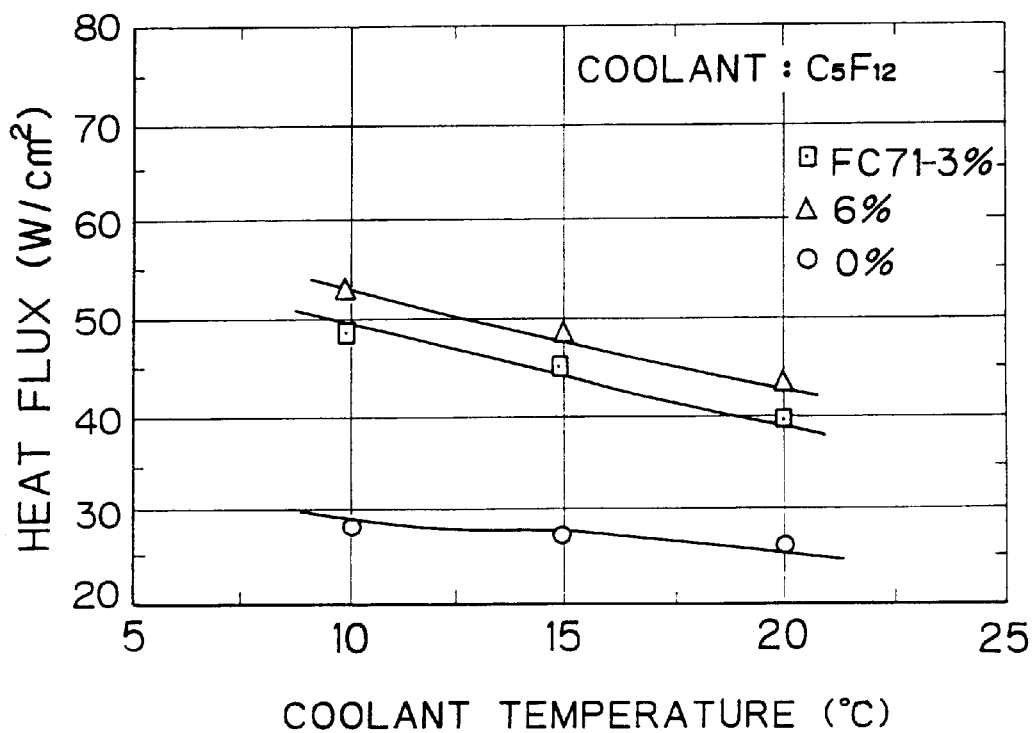
FIG. 7 shows relationships between the heat flux of a coolant and the temperature of the coolant in the double-sided cooling.

FIG. 7 shows relationships between the heat flux and the temperature of a mixed fluorocarbon coolant in which a low boiling point component was $C_5F_{12}$ (3M or Daikin) having a boiling point of 30° C., with which a high boiling point component FC-71 (3M) having a boiling point of 253° C. was mixed in an amount of 0, 3, or 6% by volume. As seen in FIG. 7, the heat fluxes of the mixed coolants comprising $C_5F_{12}$ (b.p. 30° C.) with 3 to 6 vol % FC-71 (b.p. 253° C.) were remarkably improved to 1.71 to 1.87 times that of $C_5F_{12}$ (b.p. 30° C.) at 10° C. and 1.53 to 1.65 times at 20° C., and thus the cooling capability of the fluorocarbon coolant was remarkably improved by the mixing of the coolants.

Figure 8:
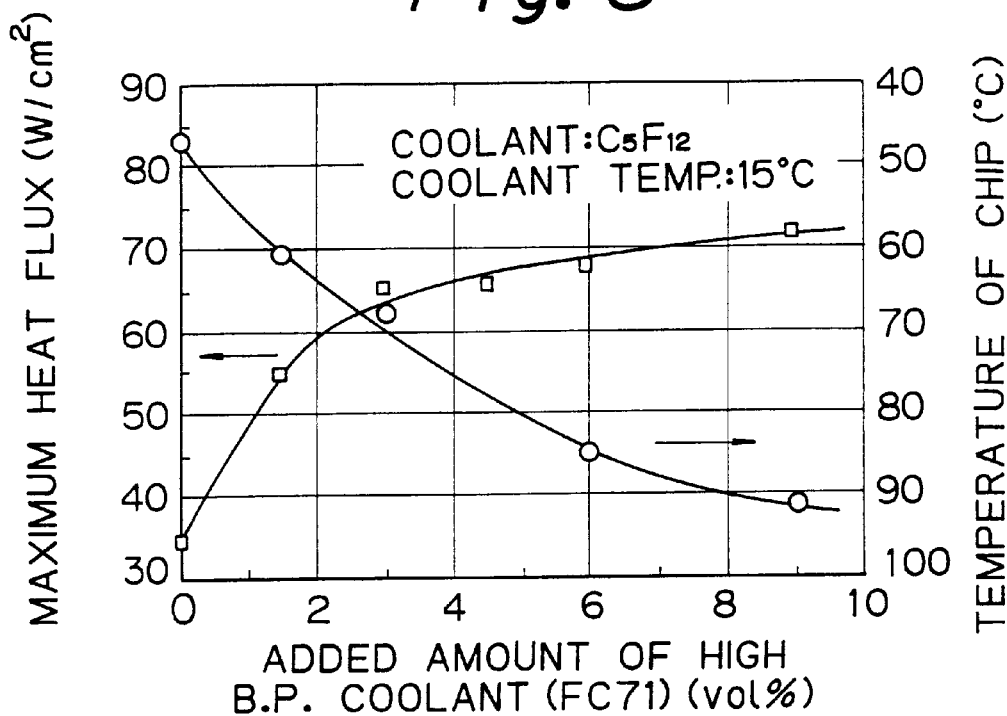
FIG. 8 shows relationships between the added amount of high boiling point coolant and the maximum heat flux of the coolant and relationships between the added amount of high boiling point coolant and the temperature of chip.

FIG. 8 shows relationships between the maximum heat flux and the amount of high boiling point fluorocarbon, and relationship between the temperature of the chip and the amount of the added high boiling point fluorocarbon, when using a mixed fluorocarbon coolant in which a low boiling point component was $C_5F_{12}$ (Daikin) having a boiling point of 30° C., to which a high boiling point component FC-71 (3M) having a boiling point of 253° C. was mixed in an amount of 0, 1.5, 3, 4.5, 6 or 9% by volume. The temperature of the coolant was controlled to 15° C.

As seen in FIG. 8, as the added amount of the high b.p. component FC-71 was increased, the maximum heat flux was rapidly increased from 35 W/cm² to 65 W/cm², in a range up to 3 vol % FC-71, but the increase of the heat flux was gradual in a range of 3 to 9 vol %; the temperature of the chip was increased almost in relation to the added amount of FC-71, from 47° C. at 0 vol % FC-71 to 84° C. at 6 vol % FC-71.

A semiconductor element mounted on a substrate was directly immersed in a mixed coolant comprising a low b.p. coolant mixed with varied amounts of a high b.p. coolant, and the mixed coolant was controlled to a temperature of 20° C. The heat generated by the semiconductor element at a temperature at which the nucleated boiling was shifted to the film boiling was measured, to obtain the maximum heat flux for a unit area, and then the relationships of the maximum heat flux with the added amount of the high b.p. coolant, this amount being based on the volume of the low b.p. coolant, were obtained. In every case, the low b.p. coolant used was FX-3250 having a b.p. of 56° C. The high b.p. coolant was FC-71 (b.p. 253° C.) in case A, FC-70 (b.p. 215° C.) in case B and FC-5311 (b.p. 165° C.) in case C, and as a comparison, FC-104 (b.p. 101° C.), which is the same as the high b.p. coolant used in Japanese Unexamined Patent Publication No. 59-125643, was used.

Figure 9:
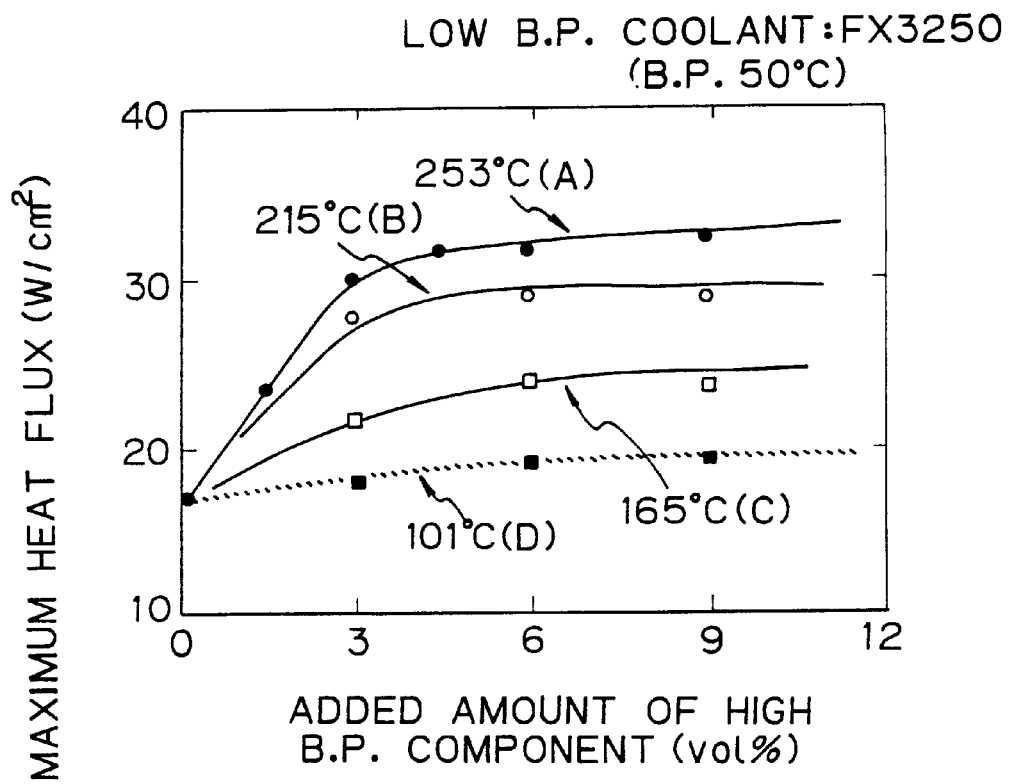
FIG. 9 shows relationships between the added amount of high boiling point coolant and the maximum heat flux of the coolant.

The results are shown in FIG. 9. In cases A and B, due to the lowering of the surface tension, the size of bubbles leaving the semiconductor element became smaller and the maximum heat flux at a temperature of a shift to the film boiling was increased to about 30 W/cm². In case C, the maximum heat flux was increased to about 24 W/cm². In contrast, in case D, where the high b.p. coolant was the same as used in JPP '643, the maximum heat flux was about 20

W/cm², which is little increased from 18 W/cm² where no high b.p. coolant was added.

When the added amount of high b.p. coolant was about 3 to 5% by volume, the maximum heat flux became almost constant, and when the added amount of high b.p. coolant was over 20% by volume, the film boiling temperature became too high, and the reliability of a semiconductor element was undesirably lowered.

Figure 10:
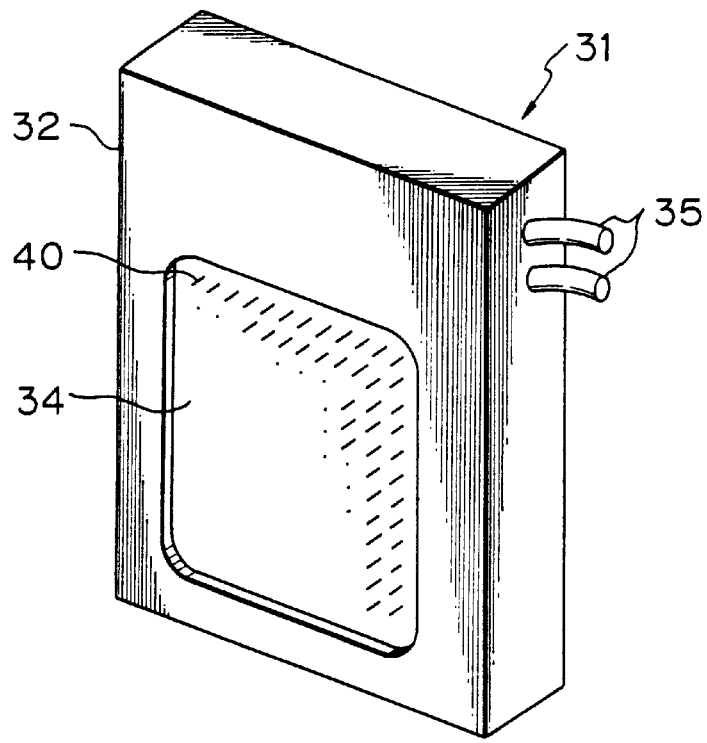
FIG. 10 is a perspective view of a liquid cooling module.
Figure 11:
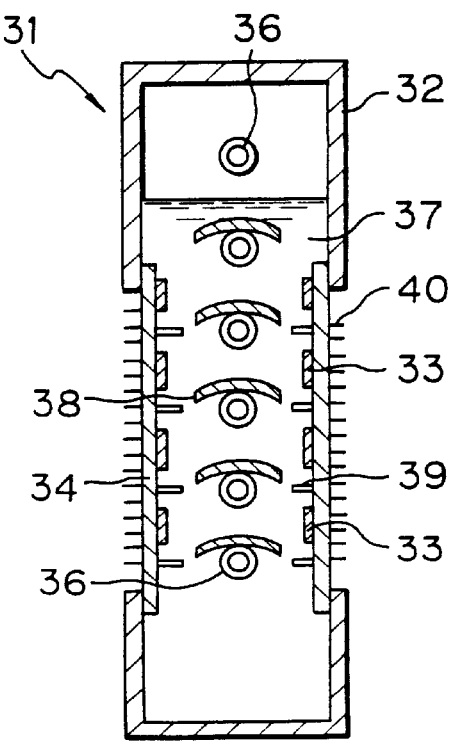
FIG. 11 is a sectional view of a liquid cooling module.
Figure 12:
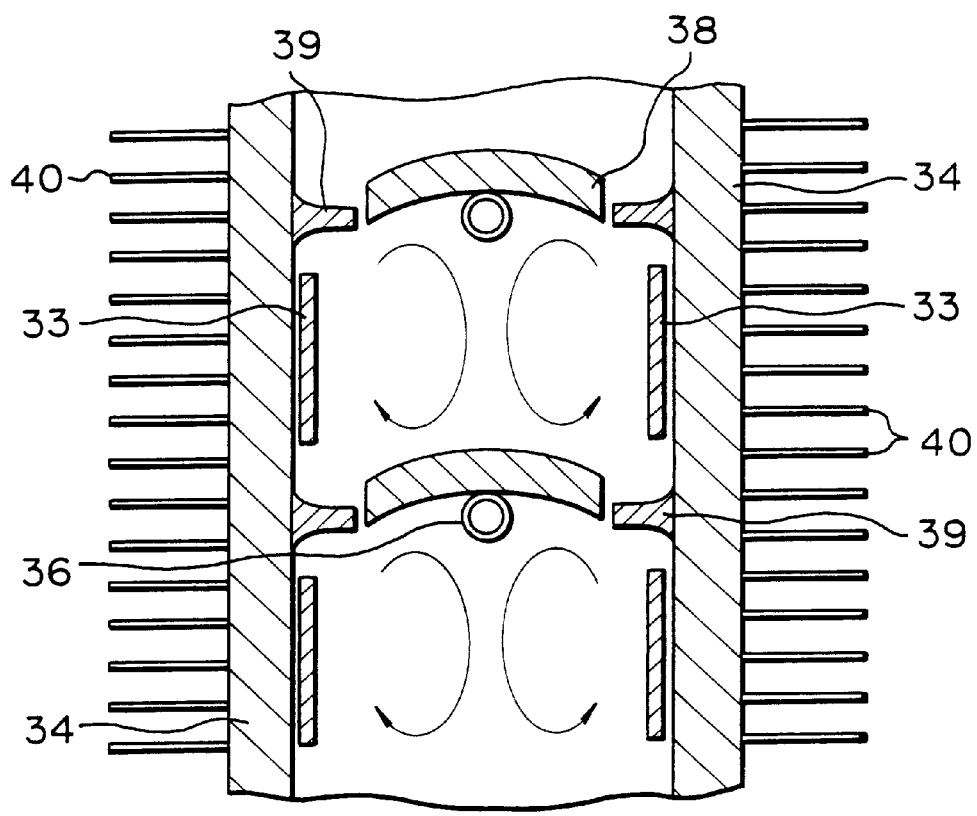
FIG. 12 is an enlarged sectional view of a liquid cooling module.

FIGS. 10 to 12 illustrate a liquid cooling module as an example of the present invention; wherein FIG. 10 is a perspective view, FIG. 11 is a sectional view, and FIG. 12 is an enlarged sectional view.

The liquid cooling module 31 comprises a metal case 32, having openings on both sides, in which ceramic substrates 34 with a plurality of semiconductor chips 33 such as LSIs mounted thereon are sealed from the inside of the case 32.

Pipes 35 for supplying cooling water are provided at an upper portion of the module 31. In the module 31, a plurality of heat exchange pipes 36 in which the cooling water is circulated are disposed, and bubble traps 38 made of a porous metal are arranged above the pipes 36 in the coolant 37. Bubble guides are arranged between the chips 33 mounted on the ceramic substrates 34, and extend laterally inwardly from the ceramic substrate, to thereby guide a coolant gas formed on the chips 33 to the bubble traps 38.

The ceramic substrates 34 may be multi-layer and have a plurality of lead pins 40 buried on the back side for connection with connectors. The plurality of semiconductor chips 33 are bonded onto wiring patterns on the ceramic substrate 34 by a flip chip bonding, and the wiring patterns are connected to the lead pins 40 through via holes.

The bubble traps 38 are provided for an effective reliquefying of the gas gasified by the chips 33. The bubble traps 38 have pores at a pitch of 20/cm³, a porosity of 20 pores per cm³, corresponding to a pore size of approximately 0.5 to 0.6 mm in diameter. In general, the bubble trap material should have a porosity within a range from about 15 to 50 pores per cm³, to achieve the intended beneficial effect, and the cooling water flows in the heat exchange pipes 36 at a flow rate of 1 l/min.

By providing bubble traps, the efficiency of the liquid cooling module becomes superior to that of liquid cooling module without bubble traps, and the reliquefication of the bubbles is accelerated so that an elevation of the temperature of the chips is suppressed.

Preferably the heat exchange pipes 36 are arranged in the coolant, not in the open space above the coolant, as if they are arranged in the open space, the efficiency of the heat exchange is lowered by a deposition onto the pipes of spray formed by breaking bubbles, etc. Therefore, the traps are preferably arranged in the coolant whereat the collected bubbles are liquefied, to obtain a maximum efficiency.

By using porous metal traps, although the bubbles are trapped, the coolant can easily pass through the traps, and therefore, the circulation of the coolant is accelerated.

The bubble guides 39 are provided for an effective guiding of bubbles, generated on the surface of the chips 33, to the traps 38. The bubble guides 39, which are made of a material not soluble in the coolant, are arranged just above and adjacent to the chips 33, whereby almost all bubbles 38 can be guided to the bubble traps 38. By providing bubble guides, the efficiency of the liquid cooling module becomes superior to that of liquid cooling modules without the bubble guides, and an elevation of the temperature of the chips is suppressed.

Figure 13:
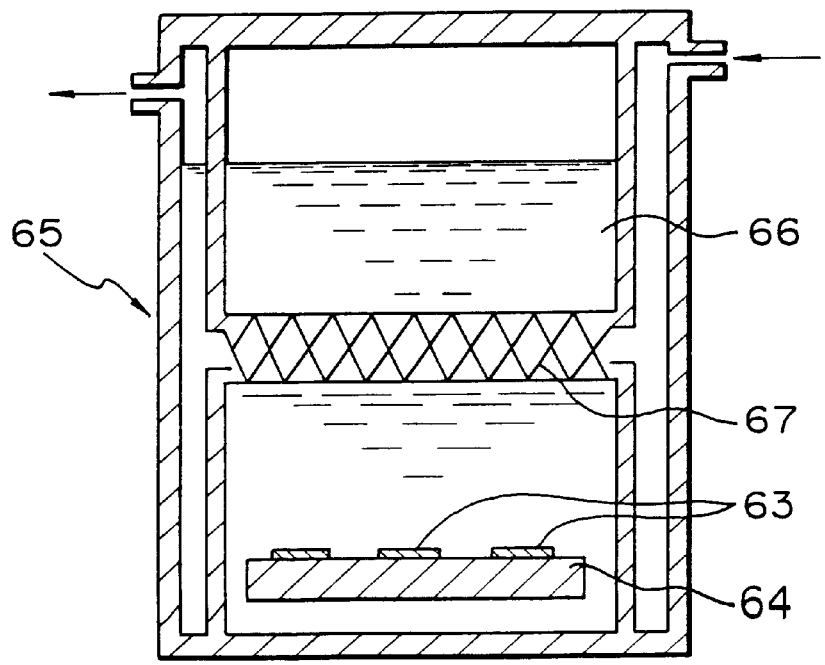
FIG. 13 is a sectional view of a first liquid cooling structure.

FIG. 13 illustrates another liquid cooling structure of the present invention, in which the semiconductor elements (LSIs) 63 are mounted on a ceramic substrate 64 by flip chip bonding, etc. and the substrate 64 is connected to an outer circuit through a connector (not shown) on the back of the substrate 64.

The cooling case 65 has a double wall structure in which the coolant 66 is charged inside the double walled case, and a heat exchanger 67 is provided to divide the coolant into up and down sections. The space formed by the double wall structure is constituted such that a flow of cooling water passing through the heat exchanger 67 is circulated.

The heat exchanger 67 has a structure by which the bubbles generated by boiling are trapped, but the coolant 66 can be easily passed through. An example is a structure of a plurality of horizontally corrugated copper pipes bonded with a copper foam, in which about 15 to 50 pores are provided per 1 cm³.

In such a construction, since all bubbles formed by the LSIs 63 are trapped and liquefied, the cooling capability is improved.

Figure 14:
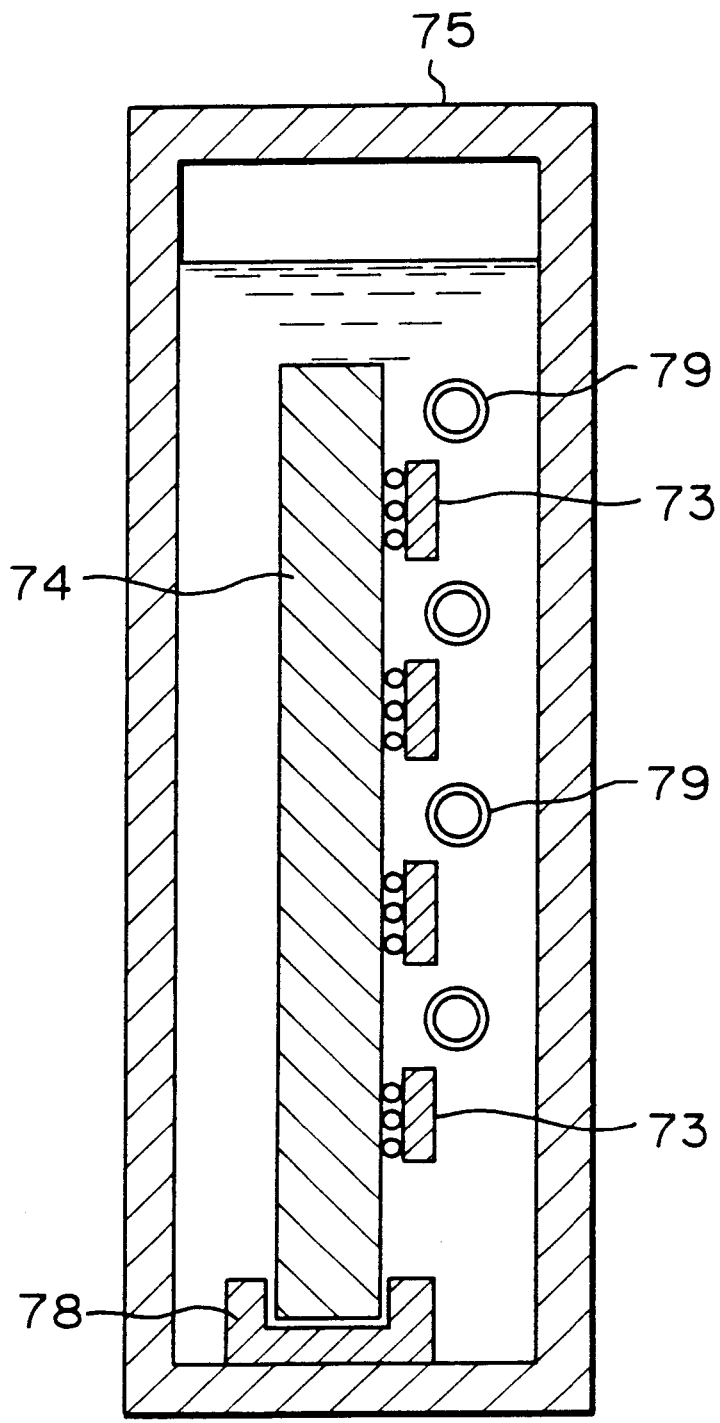
FIG. 14 is a sectional view of a second liquid cooling structure.

FIG. 14 illustrates a third liquid cooling structure of the present invention. In a closed case 75, a circuit board 74 is inserted and fixed to a connector 78, and a plurality of LSIs 73 are mounted on the circuit board 74 by flip chip bonding.

A heat exchange pipe 79 constitutes the heat exchanger and has a structure in which the pipe is folded and extends into spaces between and above the LSIs. In this structure, bubbles generated by the LSIs are in contact with a plurality of portions of the heat exchange pipe 79, while floating, and are thereby cooled, and thus the cooling capability is improved and the cooling is uniform.

Figure 15:
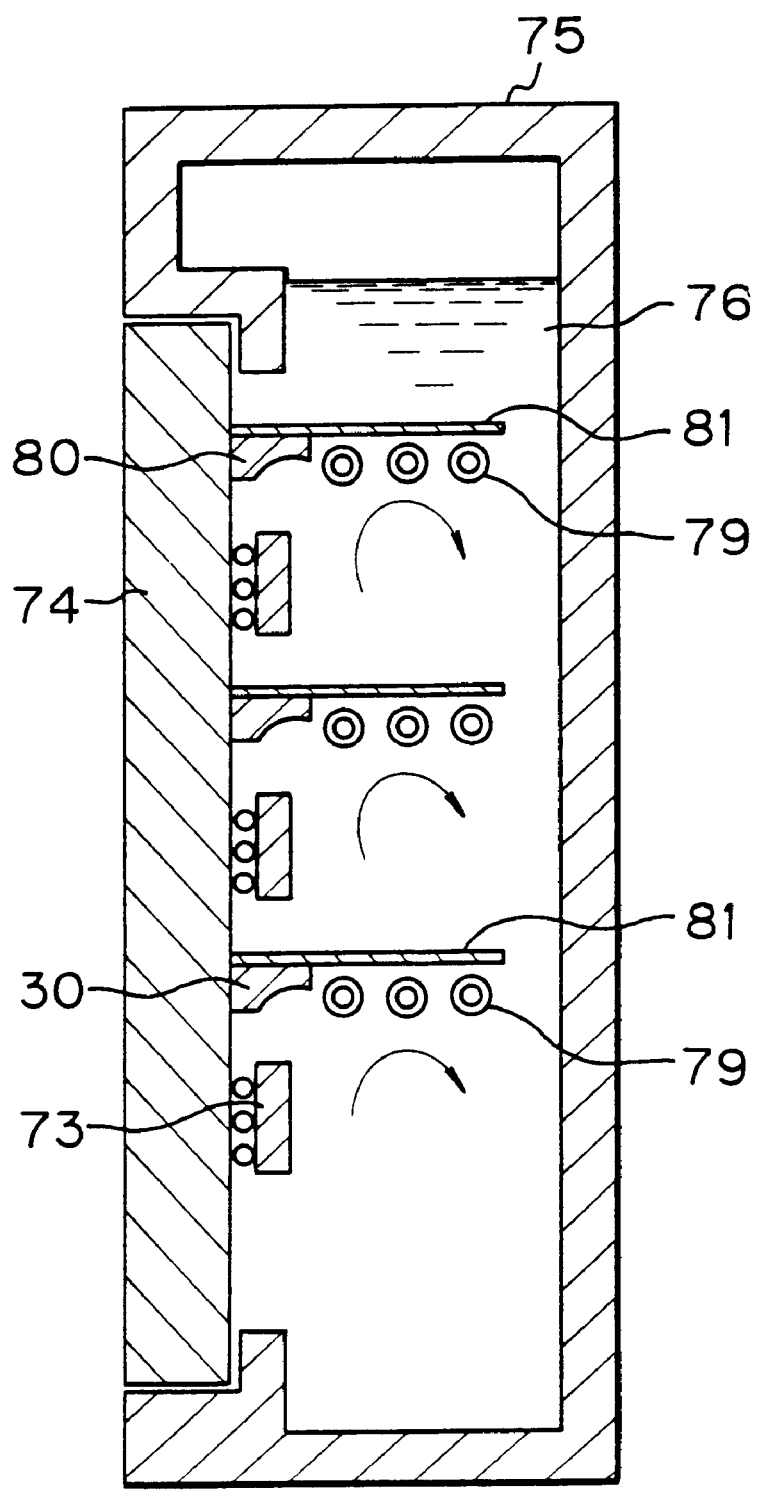
FIG. 15 is a sectional view of a third liquid cooling structure.

FIG. 15 illustrates a fourth liquid cooling structure of the present invention, which is an improvement of the third structure of FIG. 14. In this structure, the circuit board 74 is inserted and fixed to a side wall of the cooling case 75, and LSIs 73 are mounted on the circuit board 74.

Bubble guides 80 with bubble traps 81 are arranged between and above the vertically arranged LSIs 73, and a plurality of heat exchange pipes 79 are disposed below the bubble guides 80 and the bubble traps 81. The bubble traps 81 are provided with pores so that the coolant 76 can easily pass through the bubble traps 81 but the bubbles are trapped by the bubble traps 81. In one example, the bubble traps 81 are formed from a stainless steel sheet, are 0.1 mm thick, and have 0.5 to 2 mm pores.

In this structure, bubbles formed by the LSIs float and are turned by the bubble guides 80 and guided to the bubble traps 81 where they are cooled to be liquefied by the heat exchange pipes 79, whereby the cooling capability is improved.

Figure 16:
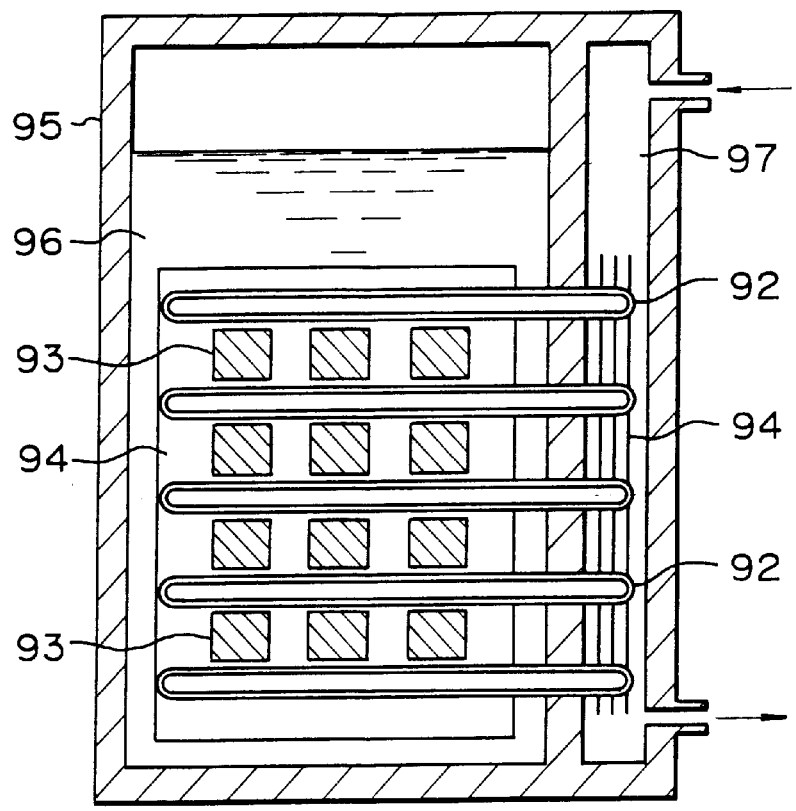
FIG. 16 is a sectional view of a fourth liquid cooling structure.

FIG. 16 illustrates a fourth liquid cooling structure of the present invention. The cooling case 95 has a double structure in which a circuit board 94 with a plurality of LSIs 93 mounted thereon are immersed in a coolant 96 and heat pipes 92 are horizontally arranged between the LSIs 93. An end of the heat pipes 92 protrudes from an inner wall of the case 95 toward a space 97 between the double walls, where the heat pipes 92 in contact with heat radiator 94 are cooled by cooling water. A preferable cooling media in the heat pipes 92 is methanol.

Figure 17:
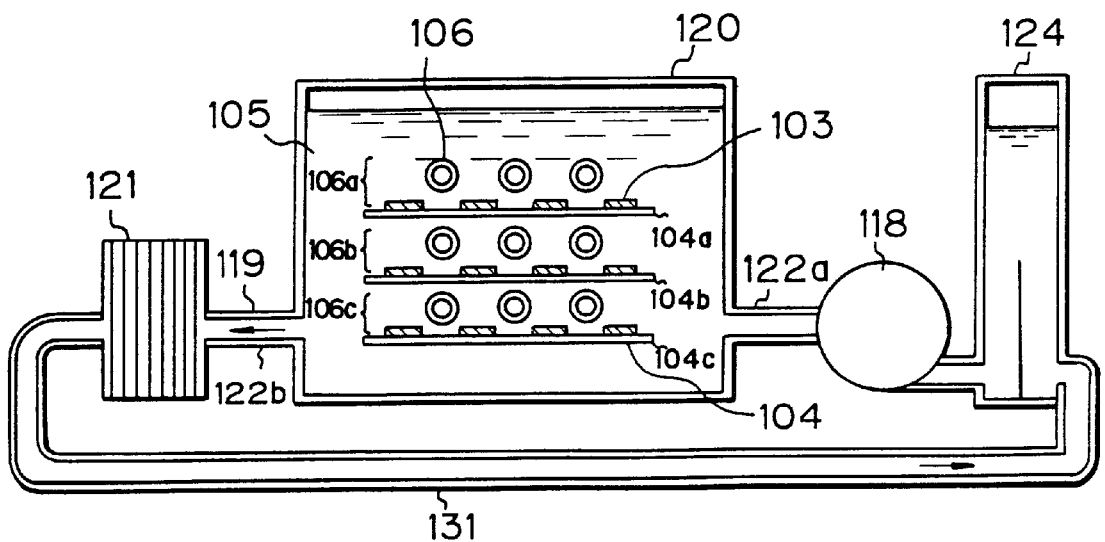
FIG. 17 is a sectional view of a fifth liquid cooling structure.

FIG. 17 is a schematic, elevational view, partially in cross-section, of a module 100 in accordance with a fifth liquid cooling structure, suitable for incorporation in a system 130. The module 100 comprises a main cooling chamber 120 containing a liquid coolant 105 therewithin, the latter being circulated by a pump 118 to pass from the chamber 100 through outlet 122b, as shown by the arrow therein, into an external heat exchanger 121, and thereafter through a return conduit 131 to a gas extractor 124 in which any released gas present in the coolant 105 is extracted. Pump 118 pressurizes the liquid coolant from the gas extractor 124 and returns the liquid coolant through inlet 122a to the main cooling chamber 120. The heat exchangers 106 with the module 100 supplement the primary reliquification function performed by the external heat exchanger 121 and significantly, correct for a deficiency which otherwise would exist if only the external heat exchanger 121 were employed, as occurs in prior art systems. Particularly, the system 130 provides forced circulation of the liquid coolant 105 by virtue of utilizing the pump 118; thus, within the module 100, the required circulation of the coolant 105 over the IC chips 103 mounted on the circuit boards 104 does not depend on convection currents. However, if sufficient heat dissipation occurs with resultant, relatively high levels of evaporation of the coolant 105, a thermal difference may develop between the upstream and downstream regions of the circuit boards 104 and the correspondingly positioned IC chips 103 mounted thereon, i.e., regions with reference to the flow of the coolant 105 from the inlet 122 and through the internal chamber of the module 100 and across the IC chips 103 to the outlet 122b.

Figure 18:
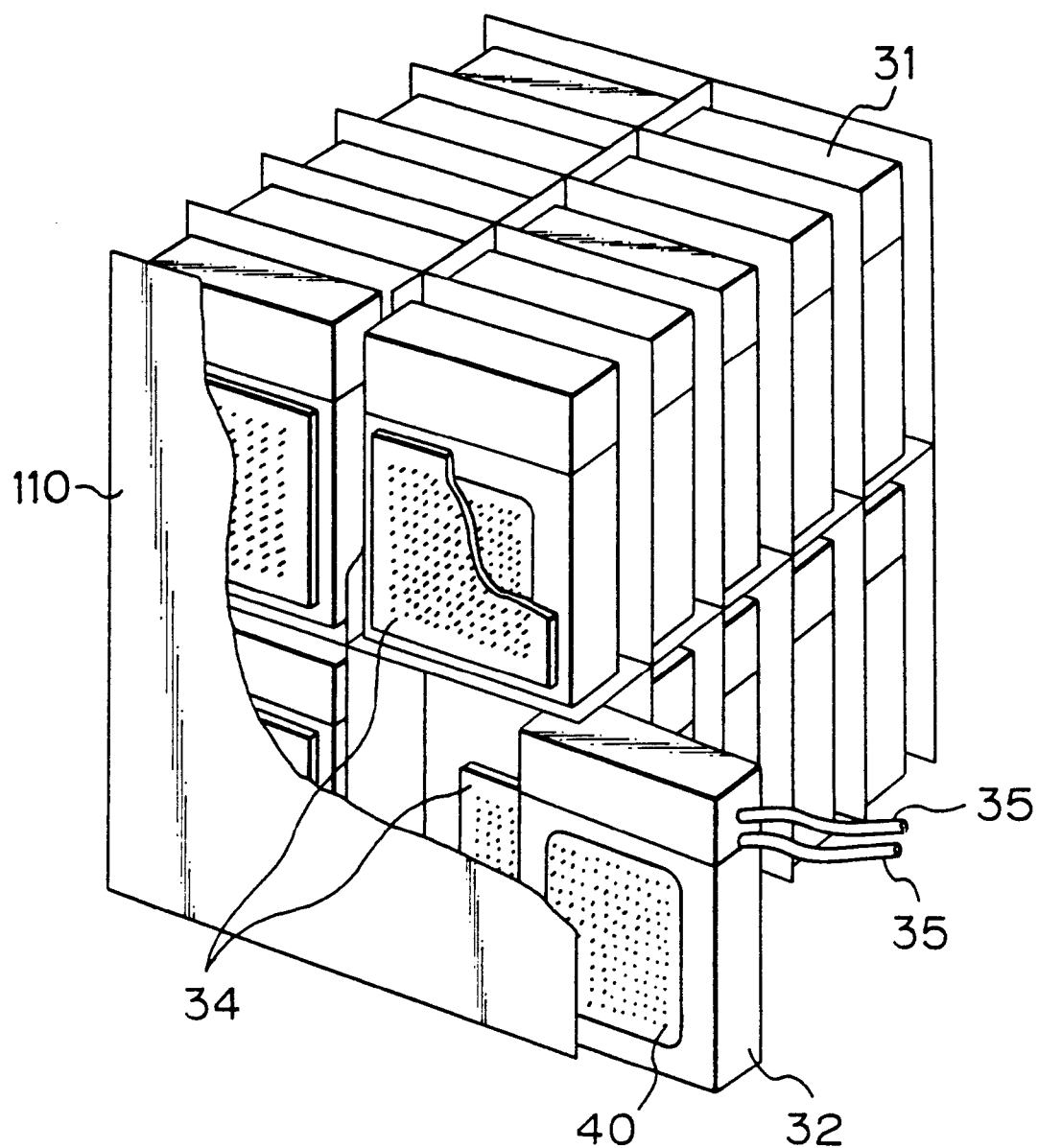
FIG. 18 is a perspective view of a system involving a plurality of liquid cooling modules.

FIG. 18 illustrates a system in which a plurality of liquid cooling modules are installed. Each cooling module 35 is similar to that shown in FIG. 16 and is covered with a box 32 of aluminum or other various materials. The modules 31 are arranged three dimensionally.

What is claimed is:

1. A coolant for cooling a semiconductor element by direct immersion cooling, used at a temperature in a range of room temperature to 80° C., consisting of a low boiling point fluorocarbon and a high boiling point fluorocarbon, the low boiling point fluorocarbon having a boiling point of 30° C. to 100° C. and the high boiling point fluorocarbon having a boiling point higher than that of the low boiling point fluorocarbon by at least 100° C., an amount of the high boiling point fluorocarbon being from 1.5% by volume to 20% by volume based on the volume of the low boiling point fluorocarbon, wherein the high boiling point fluorocarbon is selected from the group consisting of tris (perfluorohexyl) amine, tris (perfluoropentyl) amine, and

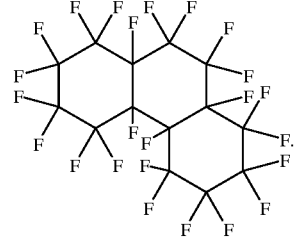

2. A coolant according to claim 1 wherein said high boiling point fluorocarbon is tris(perfluoropenthyl)amine.

3. A coolant according to claim 1 wherein said low boiling point fluorocarbon has a boiling point of 30 to 56° C. and said high boiling point fluorocarbon has a boiling point of 215 to 253° C.

4. A coolant according to claim 1 wherein said low boiling point fluorocarbon is selected from the group consisting of $C_5F_{12}$ and $C_6F_{14}$.

5. A coolant according to claim 1 wherein said high boiling point fluorocarbon is contained in an amount of less than 9% by volume, based on the volume of the low boiling point fluorocarbon.

6. A coling a semiconductor element by direct immersion cooling, used at a temperature in a range of room temperature to 80° C., consisting of a low boiling point fluorocarbon and a high boiling point fluorocarbon, the low boiling point fluorocarbon having a boiling point of 30° C. to 100° C. and the high boiling point fluorocarbon having a boiling point higher than that of the low boiling point fluorocarbon by at least 100° C., and an amount of the high boiling point fluorocarbon being from 15% by volume to 20% by volume based on the volume of the low boiling point fluorocarbon.

* * * * *